(12) United States Patent
Plaumann et al.

(10) Patent No.: US 9,912,417 B2
(45) Date of Patent: Mar. 6, 2018

(54) MEASURING DEVICE AND MEASURING METHOD FOR START TIME SYNCHRONIZED SIGNAL GENERATION

(71) Applicant: Rohde & Schwarz GmbH & Co. KG, Munich (DE)

(72) Inventors: Ralf Plaumann, Forstern (DE); Feng Xie, Markt Schwaben (DE); Thomas Lutz, Munich (DE); Michael Block, Munich (DE); Hailiang Jin, Shanghai (CN)

(73) Assignee: Rohde & Schwarz GmbH & Co. KG, Munich (DE)

( * ) Notice: Subject to any disclaimer, the term of this patent is extended or adjusted under 35 U.S.C. 154(b) by 56 days.

(21) Appl. No.: 14/814,777

(22) Filed: Jul. 31, 2015

(65) Prior Publication Data

US 2016/0036545 A1 Feb. 4, 2016

(30) Foreign Application Priority Data

Jul. 31, 2014 (CN) .......................... 2014 1 0373381

(51) Int. Cl.
*H04W 4/00* (2009.01)
*H04B 17/00* (2015.01)
*G01R 27/28* (2006.01)
*H04L 1/20* (2006.01)

(52) U.S. Cl.
CPC ......... *H04B 17/0085* (2013.01); *G01R 27/28* (2013.01); *H04L 1/20* (2013.01)

(58) Field of Classification Search
CPC .............................. G01R 31/3177; H04J 3/06
USPC .................................. 370/328–503; 714/729
See application file for complete search history.

(56) References Cited

U.S. PATENT DOCUMENTS

| | | | |
|---|---|---|---|
| 7,778,928 B2 | 8/2010 | Clark | |
| 7,933,321 B2 | 4/2011 | Kernchen | |
| 2005/0227626 A1* | 10/2005 | Stoddard | H04B 17/16 455/67.11 |
| 2007/0100570 A1* | 5/2007 | Xu | G04F 10/06 702/89 |
| 2014/0281776 A1* | 9/2014 | Champion | G01R 31/318307 714/729 |

* cited by examiner

Primary Examiner — Iqbal Zaidi
(74) Attorney, Agent, or Firm — Lee & Hayes, PLLC

(57) ABSTRACT

A measuring system comprises a timing unit and at least two signal generators. The signal generators are each configured to generate a measuring signal and to supply it to a device under test. The timing unit is configured to generate start time signals, which each indicate an allowed start time of the measuring signals. Said signal generators are configured to only start generating the measuring signals at least instances of start time signals.

16 Claims, 7 Drawing Sheets

MEASURING DEVICE AND MEASURING METHOD FOR START TIME SYNCHRONIZED SIGNAL GENERATION

FIELD OF THE INVENTION

The invention relates to a measuring device and a measuring method for generating measuring signals, especially for generating measuring signals only at allowed predefined start times. Especially, the measuring device and measuring method relate to generating TDMA downlink signals and measuring responses of devices under test.

BACKGROUND OF THE INVENTION

When performing production testing of mobile devices, for example mobile telephones, a great number of devices under test have to be processed. In recent years, increasing integration of the necessary testing equipment is a significant trend. Especially the use of integrated signal generators for providing measuring signals to several independently measured devices under test has led to new problems.

So far, a synchronization of the individual signal generators within one measuring device has not been attempted. Interference between the different signal generators within the measuring device is so far present, since for example on a first measuring path, a high amplitude signal is generated, while on a second measuring path, a low amplitude signal is generated. Due to the close spatial proximity of the individual signal generators within the measuring device, the high amplitude signal at least in part couples onto the low amplitude signal measuring path and negatively influences this measuring path. This results in a higher than necessary number of devices under test being discarded due to not meeting the desired specifications.

For example, the U.S. Pat. No. 7,772,928 B2 shows a measuring system performing a synchronization of several signal generators by use of the master-slave principle. The system shown there though is very complex, since an exact phase synchronization is performed. Moreover, the system shown there only permits the different signal generators to work in perfect union. This means that the signal generators have to start sending their respective measuring signals at exactly the same time. This results in a reduced flexibility of use.

Accordingly, one object of the invention among others is to provide a measuring system and a measuring method, which allow for performing measurements on several devices under test parallel but independently while at the same time preventing interference between the different signal generators.

SUMMARY OF THE INVENTION

According to one aspect of the invention a measuring system comprises a timing unit and at least two signal generators. The signal generators are each configured to generate a measuring signal and to supply it to a device under test. The timing unit is configured to generate start time signals, which each indicate an allowed start time of the measuring signals. Said signal generators are configured to only start generating the measuring signals at instances of start time signals. By use of the start time signals, the measuring signals are therefore at least in part synchronized. This results in a significant reduction of interference between the measuring signals generated by the signal generators.

Advantageously, said timing unit can be configured to generate said start time signals at recurring intervals. It is thereby possible to start the different measuring signals not at the same time, but as needed. This increases the flexibility of use and reduces the total time of measurement.

Moreover, advantageously, said recurring intervals of the start time signal can have a length of at least 1 ms, preferably at least 5 ms, most preferably 10 ms. Additionally or alternatively, said recurring intervals of the start time signals have a length of a multiple of a frame duration of said measuring signals. These measures lead to a high measuring flexibility and at the same to a very low interference between the different measuring signals.

Advantageously, said devices under test can be mobile telephones and said measuring signals are base station downlink TDMA signals. A very simple and efficient measurement of these standard components is therefore possible.

Further advantageously, said measuring system can comprise a reference signal generator for generating a reference signal or a reference signal input for inputting a reference signal. Said reference signal is supplied to the timing unit. Said timing unit is configured to generate said start time signals based upon said reference signal.

A very accurate generation of the start time signals is therefore possible. This results in a very low interference between the generated measuring signals.

Said timing unit can advantageously comprise a timing unit for each of said signal generators. Said timing units are each configured to generate said start time signal for the respective signal generator. Since signal generators often comprise a clock unit anyway, by using this clock unit, further production effort can be saved.

Alternatively, said timing unit can be configured to generate said start time signals for all of said generators. Especially, in case of the signal generators not comprising clock units, it is more efficient to use a single clock unit for all signal generators.

Advantageously, at least two of said signal generators can be integrated into one measuring device. Especially in light of increased integration of signal generators in production testing, the production effort of the measuring system can be reduced by these measures.

More advantageously, said timing unit is then also integrated into said one measuring device. A further increase in construction efficiency can thereby be achieved.

Alternatively, said timing unit is a separate device from said one measuring device. Said timing unit then comprises a housing separate from a housing of said one measuring device. It is thereby possible to very flexibly combine the separate timing unit with as many signal generators as desired.

Advantageously, said signal generators are individual measuring devices having separate housings. This allows for a very simple construction of the measuring system. Low-cost standard signal generators can be used.

Further advantageously, said timing unit is integrated into one of said individual measuring devices. It is thereby possible to do without a separate timing unit. Especially in case of using a signal generator, which is anyway capable of performing the function of the timing unit, great savings are possible.

Alternatively said timing unit is a separate device from said individual measuring devices. In this case said timing unit comprises a housing separate from said separate housings of said individual measuring devices. This allows maximal construction flexibility. Especially, this setup corresponds to completely separate devices on an experimenters measuring table.

Advantageously, said signal generators can be configured to start generating said measuring signals independently and synchronized only by said start time signals. A great flexibility of use is thereby achieved.

Advantageously, said measuring system can comprise at least three, preferably at least four, most preferably at least six signal generators. By integrating a greater number of signal generators into the measuring system, a lower cost per signal generator can be achieved.

Advantageously, said measuring system can comprise at least two control units each configured to control at least one of said at least two signal generators to start generating said measuring signals. Said signal generators are then each configured to start generating said measuring signal at a next of said start time signals after being controlled by said control units to start generating said measuring signal. Therefore, an accurate overall control of the measurement through the control unit is possible, while at the same time retaining the benefits of synchronizing the start times of the measuring signals.

Advantageously, said control units can be configured to receive signals from said devices under test supplied with the measuring signals by said signal generators and determining, if said devices under test conform to a measuring standard based upon comparing said received signals with thresholds and/or stored comparison signals. An automatic decision if a device under test has to be discarded or not, can thereby be performed. A very high efficiency of the measuring system is thereby achieved.

According to another aspect of the invention a measuring method uses a measuring system comprising a timing unit and at least two signal generators. The signal generators each generate a measuring signal and supply it to a device under test. The timing unit generates start time signals, which each indicate an allowed start time of the measuring signals. Said signal generators only start generating the measuring signals at instances of start time signals. A very efficient and flexible and accurate measurement is thereby possible.

BRIEF DESCRIPTION OF THE DRAWINGS

An exemplary embodiment of the invention is now further explained with respect to the drawings by way of example only. In the drawings.

DETAILED DESCRIPTION

Figure 3:
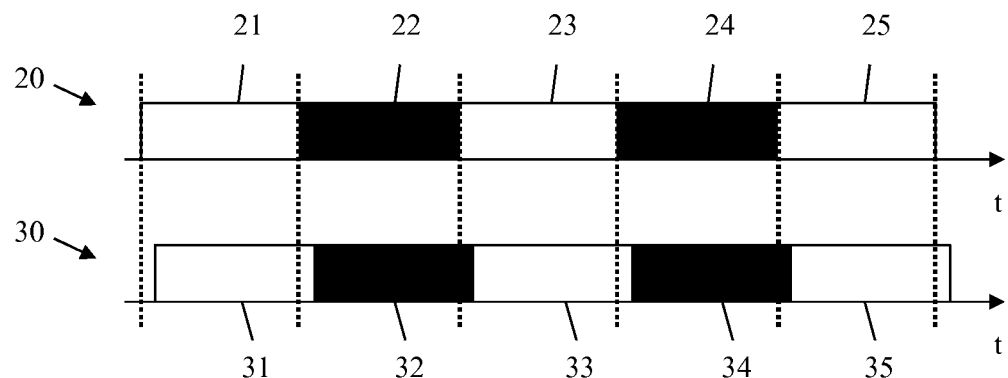
FIG. 3 shows measuring signals in an exemplary measuring system.
Figure 4:
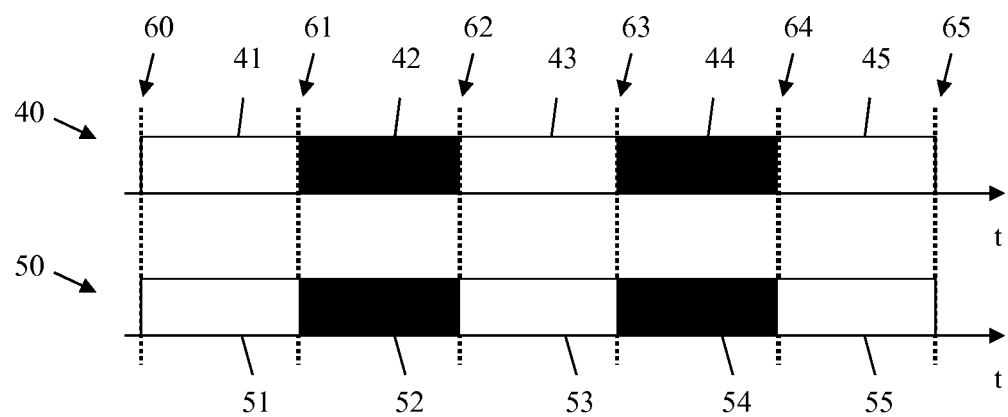
FIG. 4 shows measuring signals in a third embodiment of the inventive measuring system.

First, we demonstrate the general construction and function of embodiments of the inventive measuring system along FIG. 1a, FIG. 1b, FIG. 1c, FIG. 1d, and FIG. 2. With reference to FIG. 3 and FIG. 4, advantages of an embodiment of the inventive measuring system and measuring method are explained. Finally, an embodiment of the inventive measuring method is described with reference to FIG. 5. Similar entities and reference numbers in different figures have been partially omitted.

Figure 1A:
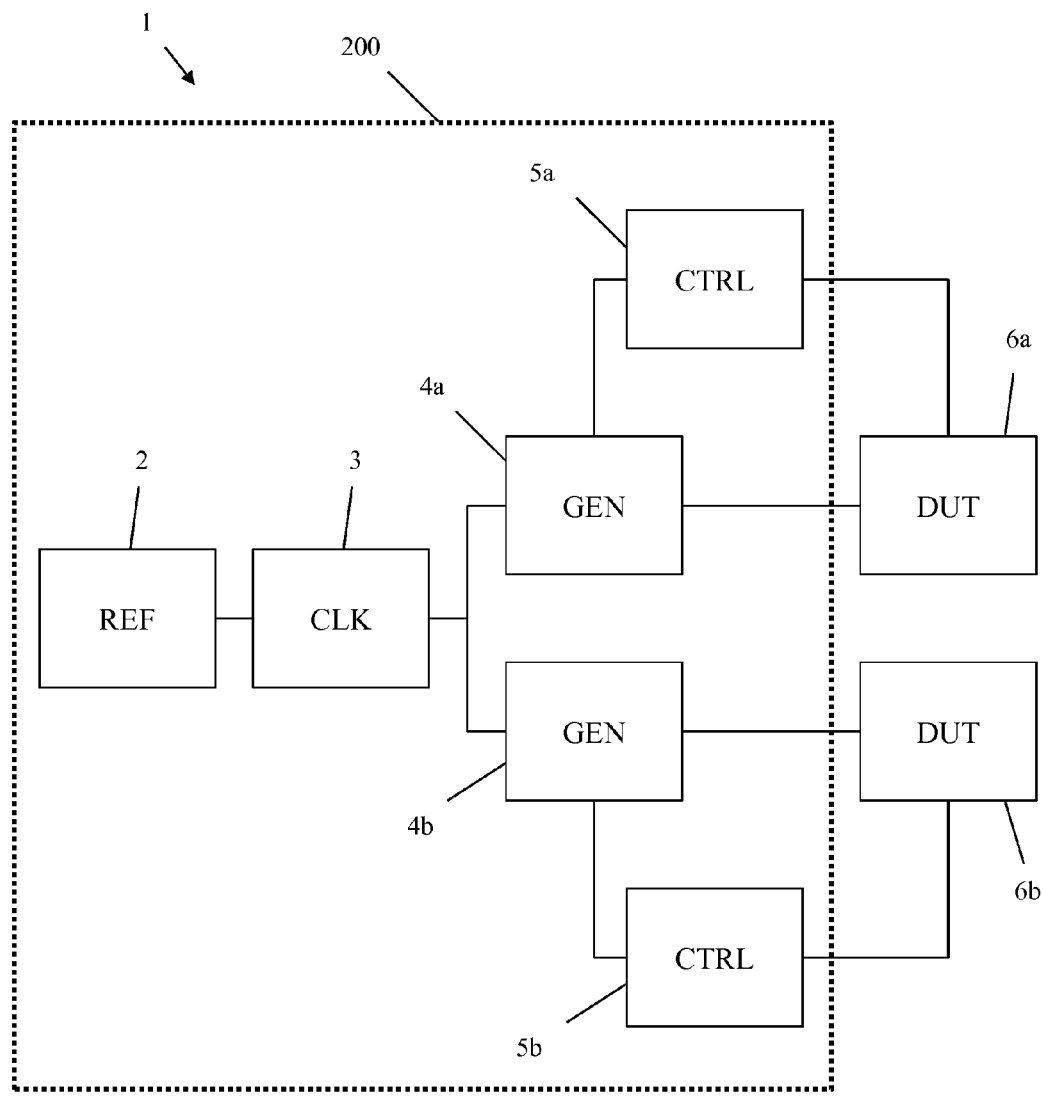
FIG. 1a shows a first embodiment of the inventive measuring system in a block diagram.

In FIG. 1a, a block diagram of a first embodiment of the inventive measuring system 1 is shown. The measuring system 1 comprises a reference signal generator 2 connected to a timing unit 3, which is connected to a first signal generator 4a and a second signal generator 4b. The first signal generator 4a is furthermore connected to a control unit 5a and to a device under test 6a. The control unit 5a is furthermore connected to the device under test 6a. The second signal generator 4b is connected to a second device under test 6b and a second control unit 5b. The second control unit 5b is connected to the second device under test 6b. The devices under test 6a, 6b are not part of the measuring system 1. The measuring system 1 is completely integrated into a single housing 200.

The reference signal generator 2 generates a reference signal and supplies it to the timing unit 3. The timing unit 3 generates start time signals based upon the reference signal provided by the reference signal generator 2. The start time signals indicate allowed start times of measuring signals generated by the signal generators 4a, 4b. The start time signals are generated at recurring intervals. For example, the intervals are at least 1 ms, preferably at least 5 ms, most preferably 10 ms. The recurring intervals of the start time signals have a length of a multiple of a frame duration of measuring signals generated by the signal generators 4a, 4b. The start time signals are provided to the signal generators 4a, 4b by the timing unit 3.

The signal generators 4a, 4b, generate measuring signals, if instructed to do so by the control units 5a, 5b. As soon as such an instruction to generate a measuring signal reaches a signal generator 4a, 4b, the signal generator waits until the next start time signal is received from the timing unit 3 and then starts generating the measuring signal.

Therefore, the signal generators 4a, 4b, 14a, 14b are configured to only start generating the measuring signals, after the next instance of a start time signal, when they are instructed to begin generating the measuring signal by the respective control unit 5a, 5b.

The measuring signal is then transmitted to the device under test 6a, 6b. The respective control unit 5a, 5b furthermore receives signals from the device under test 6a, 6b and then determines based upon the signals received from the device under test 6a, 6b, if the respective device under test 6a, 6b meets desired specifications by comparing the signals to threshold values or reference measuring signals.

In the example shown here, the timing unit 3, the signal generator 4a and the signal generator 4b are separate entities. Alternatively, the signal generators 4a, 4b could be integrated into a single measuring device having two separate signal generators 4a, 4b.

Also, in the example shown here, only two signal generators 4a, 4b and two devices under test 6a, 6b are shown. The measuring system 1 though can also comprise more than two signal generators. Especially, the measuring system 1 can comprise three, four, six, etc. signal generators.

Furthermore, the measuring system 1 can comprise for example signal analyzers, which are connected to the devices under test 6a, 6b and to the control units 5a, 5b, which measure properties of the signals generated by the devices under test 6a, 6b. These results are then used by the control units 5a, 5b to judge the respective device under test 6a, 6b.

In the example shown in FIG. 1a, connecting trigger lines between the timing unit 3 and the signal generators 4a, 4b are internal trigger lines.

Figure 1B:
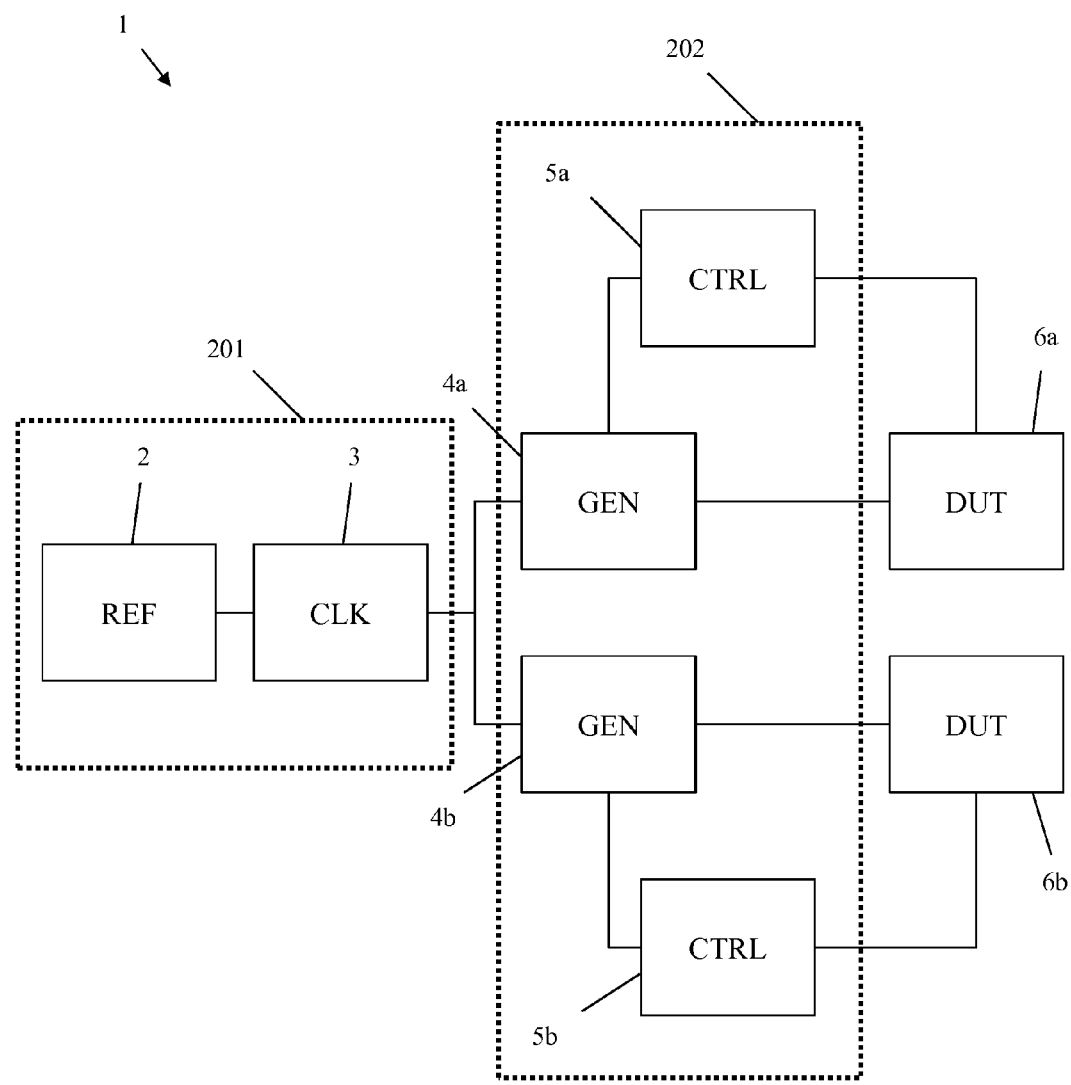
FIG. 1b shows a second embodiment of the inventive measuring system in a block diagram.

In FIG. 1b, a further embodiment of the inventive measuring system 1 is shown. Here, the reference signal generator 2 and the timing unit 3 form a separate device from the signal generators 4a, 4b and the control units 5a, 5b. The reference signal generator 2 and the timing unit 3 comprise a separate housing 201 from a housing 202 of the signal generators 4a, 4b and the control units 5a, 5b.

In the example shown in FIG. 1b, the connecting trigger lines between the timing unit 3 and the signal generators 4a, 4b are external trigger lines connecting the separate housings.

This setup corresponds to a multi-channel signal generator and a separate timing unit.

Figure 1C:
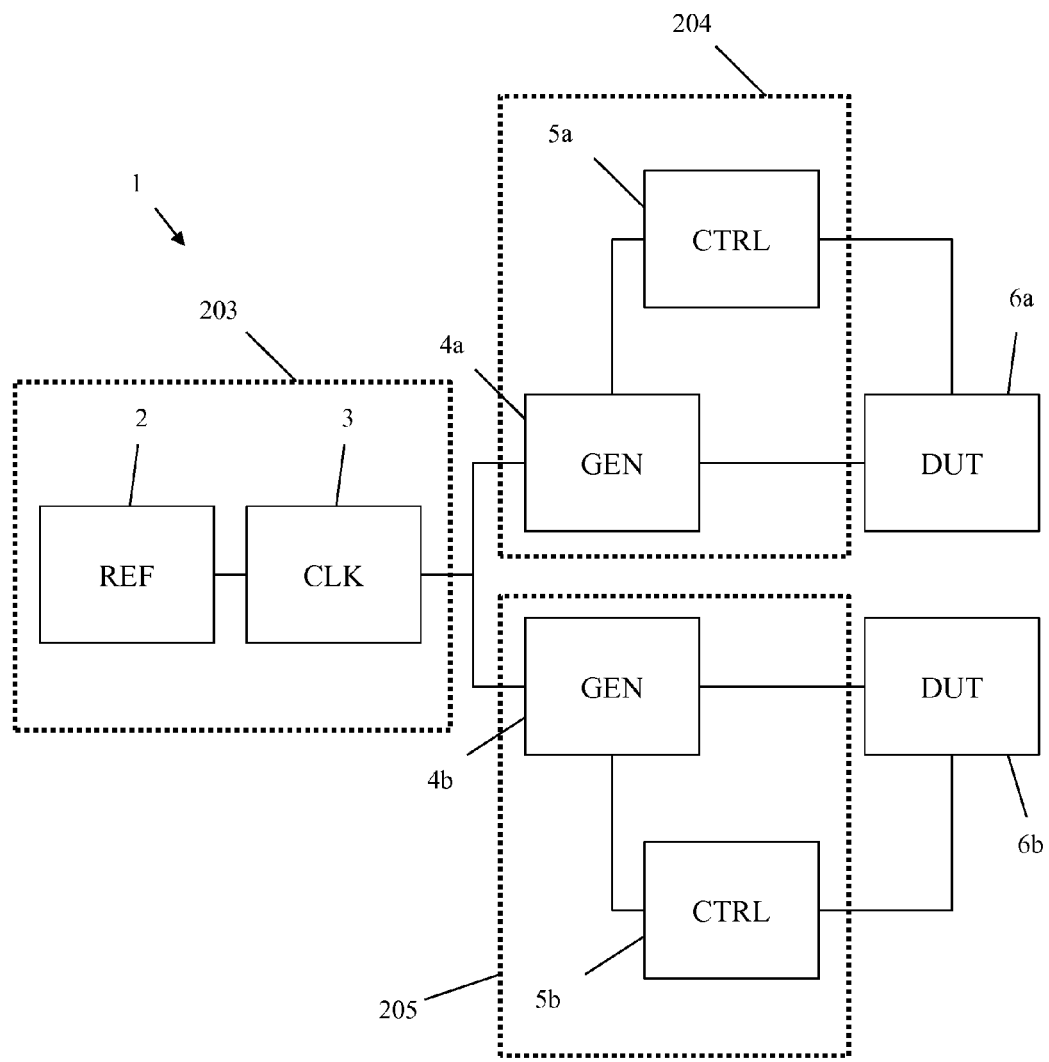
FIG. 1c shows a third embodiment of the inventive measuring system in a block diagram.

In FIG. 1c, a further embodiment of the inventive measuring system 1 is shown. Here also the signal generators 4a, 4b and the control units 5a, 5b have two separate housings 204, 205. The reference signal generator 2 and the timing unit 3 form a separate device with a separate housing 203. The signal generator 4a and the control unit 5a form a separate measuring device with a separate housing 204. The signal generator 4b and the control unit 5b form a separate measuring device with a separate housing 205.

In the example shown in FIG. 1c, the connecting trigger lines between the timing unit 3 and the signal generators 4a, 4b are external trigger lines connecting the separate housings.

This setup corresponds to three completely separate devices. Especially by using single-channel signal generators, the devices can be low-complexity and therefore low-cost devices.

Figure 1D:
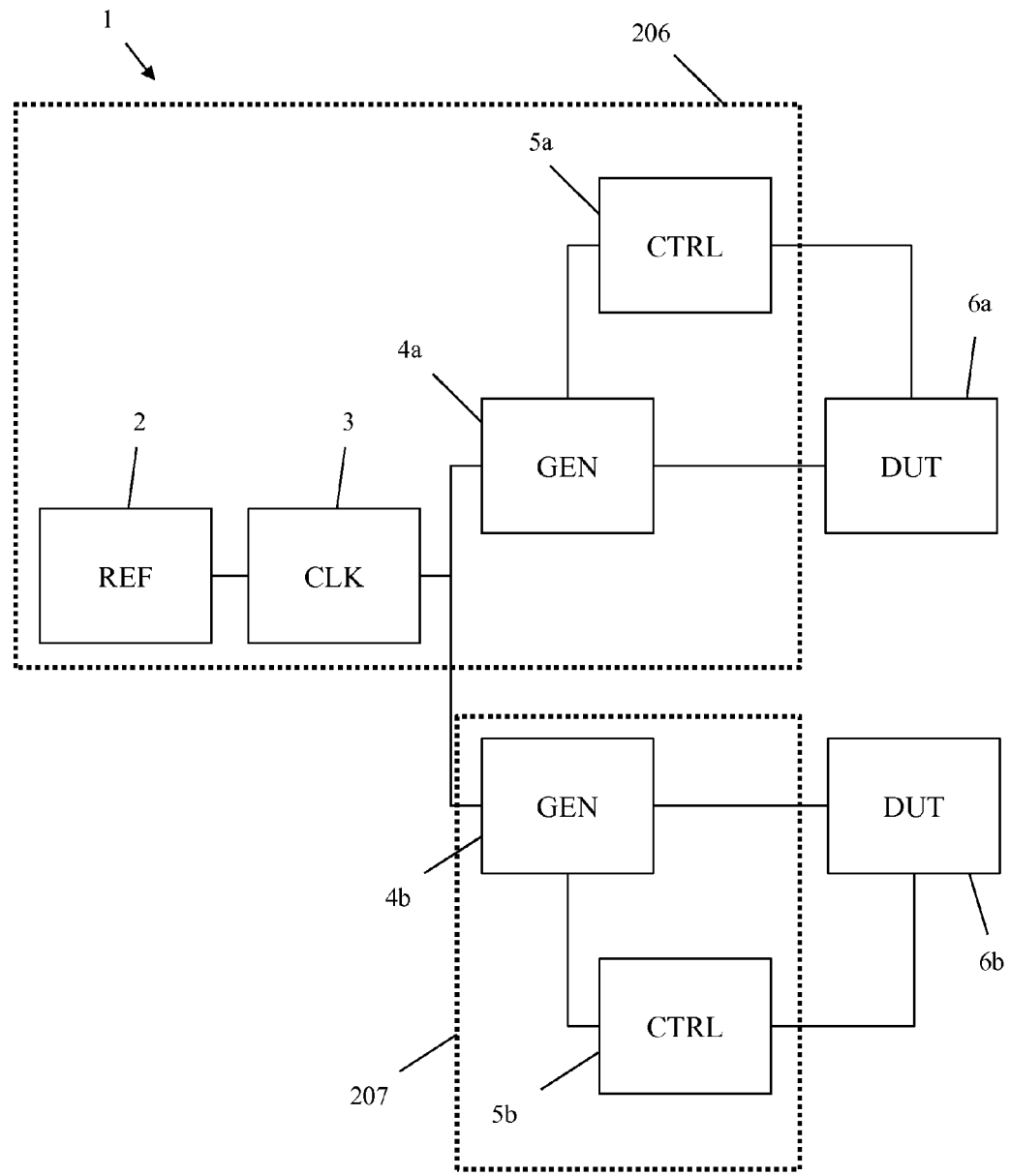
FIG. 1d shows a fourth embodiment of the inventive measuring system in a block diagram.

In FIG. 1d, a further embodiment of the inventive measuring system 1 is shown. Here, the reference signal generator 2, the timing unit 3, the signal generator 4a and the control unit 5a form a separate measuring device with a separate housing 206. The signal generator 4b and the control unit 5b form a separate measuring device with a separate housing 207.

In the example shown in FIG. 1d, the connecting trigger line between the timing unit 3 and the signal generator 4a is an internal trigger lines. The trigger line connecting the timing unit 3 and the signal generator 4b though is an external trigger line connecting the separate housings.

This setup corresponds to two separate signal generators, one of which comprising the timing unit. This setup offers a lowest possible complexity, if the signal generator is anyway capable of performing the functions of the timing unit. Also an identical construction of the two signal generators is possible in this example.

The different alternatives shown in FIG. 1a-FIG. 1d allow for a very flexible division of the components into different measuring devices and housings.

Figure 2:
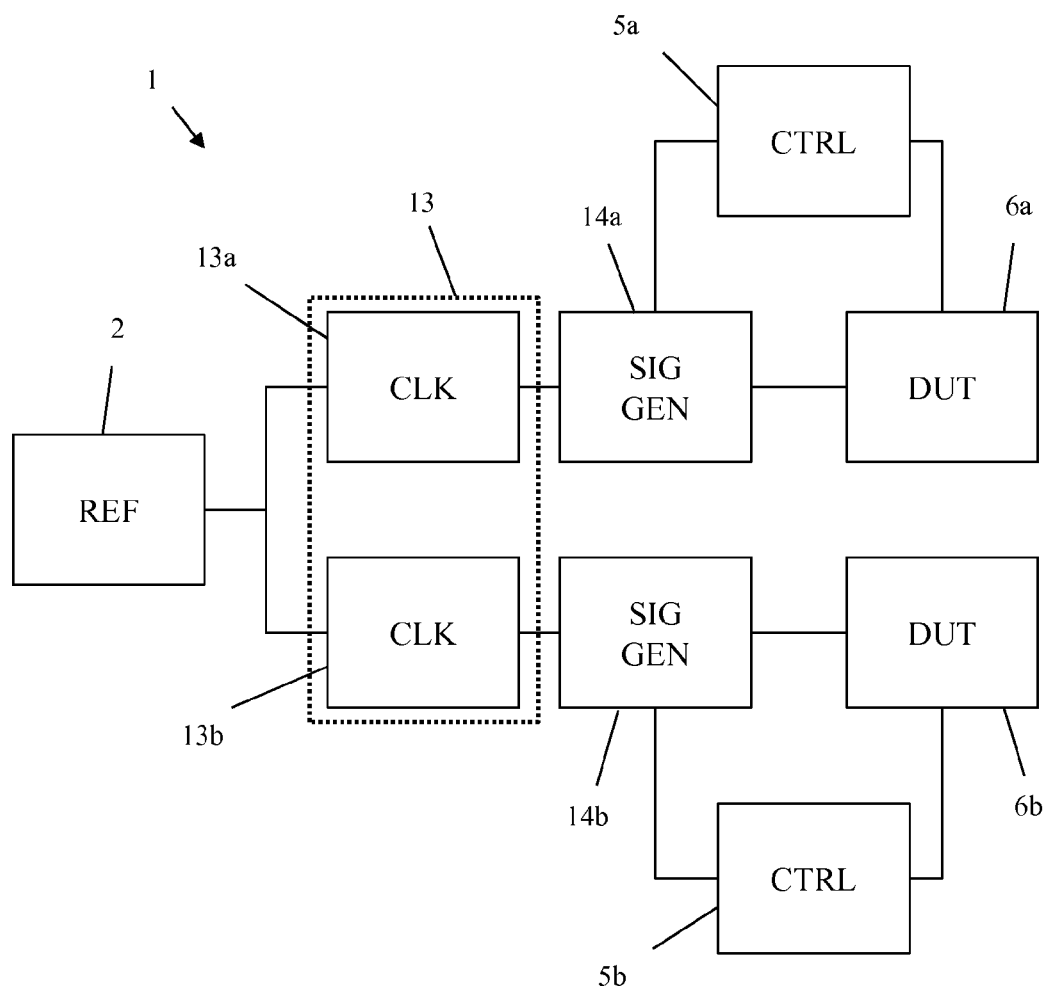
FIG. 2 shows a fifth embodiment of the inventive measuring system in a block diagram.

In FIG. 2, a second embodiment of the inventive measuring system 1 is depicted. Here, the timing unit 13, which corresponds to the timing unit 3 of FIG. 1a-d comprises two separate timing units 13a and 13b, which are each allocated to a signal generator 14a, 14b, which correspond to the signal generators 4a, 4b of FIG. 1a-d. Therefore, the reference signal generated by the reference signal generator 2 is supplied independently to the timing units 13a and 13b, which generate separate start time signals, which are supplied to the signal generators 14a, 14b.

The embodiment shown here is especially advantageous, if the signal generators 14a, 14b are separate measuring devices, which each comprise a clock unit anyway. In this case, the housing of the signal generator 14a, 14b also encompasses the timing units 13a, 13b.

Also here, it is possible that both signal generators 14a, 14b and the timing unit 13 is integrated into a single measuring device.

In the embodiments shown in FIG. 1a-d and FIG. 2, the signal generators 4a, 4b, 14a, 14b are each controlled by a single control unit 5a, 5b. Alternatively though, a single control unit could control more than one signal generator. For example, one control unit could control two or more signal generators.

In FIG. 3, measuring signals of a non-synchronized measuring system are shown. A measuring signal 20 of a first signal generator comprises frames 21-25. The frames 21, 23, and 25 are transmit-frames, while the frames 22 and 24 are receive-frames. At the same time, a measuring signal 30 is generated by a second signal generator. The measuring signal 30 comprises frames 31-35. The frames 31, 33, and 35 are transmit-frames, while the frames 32 and 34 are receive-frames. Since the measuring signals 20 and 30 are not synchronized in any manner, often the frame timing is not identical. As can be seen here, the frames 21-25 and 31-35 are not synchronous. Especially along the frame borders, interference between the measuring signals 20, 30 occurs.

In FIG. 4, measuring signals 40, 50 of an embodiment of the inventive measuring system or measuring method are shown. The measuring signal 40 is generated by a signal generator and comprises the frames 41-45. The measuring signal 50 is generated by a second signal generator and comprises the frames 51-55. The frames 41, 43, 45, 51, 53, 55 are transmit-frames, while the frames 42, 44, 52, 54 are receive-frames.

Additionally, in FIG. 4, start time signals 60, 65 are shown. These signals 60-65 are pulses, which coincide with frame borders of frames 41-45, 51-55. Since both signal generators can only begin generating a measuring signal 40, 50 at the moment of occurrence of a start time signal 60-65, the frames 41-45 and 51-55 are synchronized. Therefore, interference along the frame borders is prevented.

It is important to note that only the transmit frames of the measuring signals are actually generated by the signal generators. The receive-frames are frames in which the devices under test have the opportunity to send uplink signals back.

Figure 5:
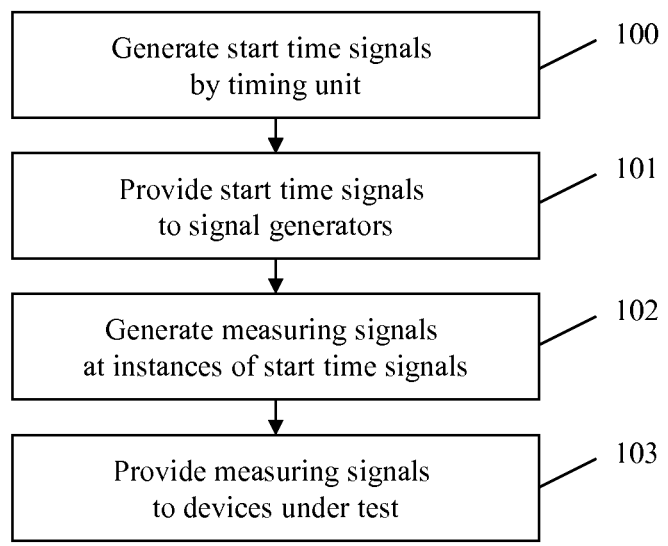
FIG. 5 shows an embodiment of the inventive measuring method in a flow diagram.

In FIG. 5, an embodiment of the inventive measuring method is shown in a flow diagram. In a first step 100, start time signals are generated by a timing unit. In order to do so, the timing unit advantageously uses a reference signal. The start time signals are repetitive and occur at recurring intervals. In a second step 101, the start time signals are provided to signal generators, which generate measuring signals in a third step 102. The measuring signals are only generated at instances of the start time signals. In a final step 103, the measuring signals are provided to devices under test. Regarding the details of the function of the method, it is referred to our previous elaborations regarding the measuring system.

The invention is not limited to the examples shown above. Especially, it is not limited to TDMA signals and the use of only two signal generators. The characteristics of the exemplary embodiments can be used in any advantageous combination. The features of dependent system claims can also be features of the method claim.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measuring system comprising a timer, at least two signal generators, and at least two control units,
    wherein the signal generators are each configured to generate a measuring signal and to supply the measuring signal to a device under test,
    wherein the timer is configured to generate start time signals, which each indicate an allowed start time of the measuring signals,
    wherein said signal generators are configured to only start generating the measuring signals at instances of start time signals,
    wherein said control units are each configured to control at least one of said at least two signal generators to start generating said measuring signals, to receive signals from said devices under test supplied with the measuring signals by said signal generators, and to determine if said devices under test conform to measuring specification based upon comparing said received signals with thresholds or stored comparison signals, and
    wherein said signal generators are each configured to start generating said measuring signal at a next of said start time signals after being controlled by said control units to start generating said measuring signal.

2. The measuring system according to claim 1,
    wherein said timer is configured to generate said start time signals at recurring intervals.

3. The measuring system according to claim 2,
    wherein said recurring intervals of the start time signals have a length of at least 1 ms, preferably at least 5 ms, most preferably 10 ms, or
    wherein said recurring intervals of the start time signals have a length of a multiple of a frame duration of said measuring signals.

4. The measuring system according to claim 1,
    wherein said devices under test are mobile telephones, and
    wherein said measuring signals are TDMA basestation downlink signals.

5. The measuring system according to claim 1,
    wherein said measuring system comprises a reference signal generator for generating a reference signal or a reference signal input for inputting a reference signal,
    wherein said reference signal is supplied to the timer, and
    wherein said timer is configured to generate said start time signals based upon said reference signal.

6. The measuring system according to claim 1,
    wherein said timer comprises a timer for each of said signal generators, and
    wherein said timers are each configured to generate said start time signals for the respective signal generator.

7. The measuring system according to claim 1,
    wherein said timer is configured to generate said start time signals for all of said signal generators.

8. The measuring system according to claim 1,
    wherein at least two of said signal generators are integrated into one measuring device.

9. The measuring system according to claim 8,
    wherein said timer is integrated into said one measuring device.

10. The measuring system according to claim 8,
    wherein said timer is a separate device from said one measuring device, and
    wherein said timer comprises a housing separate from a housing of said one measuring device.

11. The measuring system according to claim 1,
    wherein said signal generators are individual measuring devices having separate housings.

12. The measuring system according to claim 11,
    wherein said timer is integrated into one of said individual measuring device measuring devices.

13. The measuring system according to claim 11,
    wherein said timer is a separate device from said individual measuring devices, and
    wherein said timer comprises a housing separate from said separate housings of said individual measuring devices.

14. The measuring system according to claim 1,
    wherein said signal generators are configured to start generating said measuring signals independently and synchronized only by said start time signals.

15. The measuring system according to claim 1,
    wherein said measuring system comprises at least three, preferably at least four, most preferably at least six signal generators.

16. A measuring method using a measuring system comprising a timer, at least two signal generators, and at least two control units,
    wherein the signal generators each generate a measuring signal and supply the measuring signal to a device under test,
    wherein the timer generates start time signals, which each indicate an allowed start time of the measuring signals, and
    wherein said signal generators only start generating the measuring signals at instances of start time signals,
    wherein said control units are each configured to control at least one of said at least two signal generators to start generating said measuring signals, to receive signals from said devices under test supplied with the measuring signals by said signal generators, and to determine if said devices under test conform to measuring specification based upon comparing said received signals with thresholds or stored comparison signals, and
    wherein said signal generators are each configured to start generating said measuring signal at a next of said start time signals after being controlled by said control units to start generating said measuring signal.

* * * * *